(12) United States Patent
Deng et al.

(10) Patent No.: US 6,593,195 B1
(45) Date of Patent: *Jul. 15, 2003

(54) STABLE MEMORY DEVICE THAT UTILIZES ION POSITIONING TO CONTROL STATE OF THE MEMORY DEVICE

(75) Inventors: Xiaojun Deng, Orlando, FL (US); Isik C. Kizilyalli, Orlando, FL (US); Stephen C. Kuehne, Orlando, FL (US)

(73) Assignee: Agere Systems INC, Allentown, PA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/241,271

(22) Filed: Feb. 1, 1999

(51) Int. Cl.[7] ................... H01L 21/336; H01L 21/8238; H01L 21/76; H01L 21/3205
(52) U.S. Cl. ................... 438/288; 438/216; 438/783; 438/784
(58) Field of Search .................... 257/651, 410, 257/411, 645, 405; 438/288, 287, 216, 261, 421, 591, 595, 954, 981

(56) References Cited

U.S. PATENT DOCUMENTS 3,470,610 A * 10/1969 Breitweiser .................. 257/405

(List continued on next page.)

FOREIGN PATENT DOCUMENTS

JP          404361534 A * 12/1992

OTHER PUBLICATIONS

Vanheusden et al., Non-volatile memory device based on mobile protons in SiO2 thin films, Apr. 10, 1997, Letters to Nature, pp. 587–589.*

Vanheusden, et al., "Non-Volatile Memory Device Based on Mobile Protons in $SiO_2$ Thin Films," Letters to Nature, vol. 386, Apr. 10, 1997, pp. 587–589.

"VLSI Technology," Ed. S.M. Sze, pp. 120–122, No Date.

Lifshitz, et al., "Mobile Charge in a Novel Spin–On Oxide (SOX): Detection of Hydrogen in Dielectrics," J. Electrochem. Soc., vol. 136, No. 5, May 1989, pp. 1440–1446.

Chapter 3.4.1, "Deposition Methods," Dielectric and Polysilicon Film Deposition, pp. 107–111 No Date.

Primary Examiner—Caridad Everhart
Assistant Examiner—Chuong Anh Luu
(74) Attorney, Agent, or Firm—Peter V. D. Wilde

(57) ABSTRACT

The memory element of the present invention utilizes a substrate, a first conductive connection, a second conductive connection, and an ionic layer. The substrate includes a source region, a drain region, and a channel region, which is disposed between the source region and the drain region. The ionic layer includes ions and is coupled to the substrate. The first connection is coupled to the source region, and the second connection is coupled to the drain region. An electrical field is applied through said ionic layer such that the ions in the ionic layer move. When the memory element is to exhibit a logical high state, the polarity of the electrical field causes the ions to move toward the channel region. This pulls the electrons in the source and drain regions into the channel region making the channel region conductive. When the memory element is to exhibit a logical low state, the polarity of the electrical field causes the ions to move away from the channel region. As a result, the channel region becomes non-conductive, and the first conductive connection is, therefore, insulated from the second conductive connection.

7 Claims, 4 Drawing Sheets

U.S. PATENT DOCUMENTS

| | | | |
|---|---|---|---|
| 3,936,329 A * | 2/1976 | Kendall et al. | 438/492 |
| 4,047,974 A * | 9/1977 | Harari | 438/288 |
| 4,217,601 A * | 8/1980 | DeKeersmaecker et al. | 257/325 |
| 5,332,581 A | 7/1994 | Fugihira | 505/170 |
| 5,349,222 A | 9/1994 | Shimoji | 257/326 |
| 5,389,581 A | 2/1995 | Freiberger et al. | 437/238 |
| 5,521,107 A * | 5/1996 | Yamazaki et al. | 438/303 |
| 5,583,066 A | 12/1996 | Jung | 437/43 |
| 5,620,905 A * | 4/1997 | Konuma et al. | 438/163 |
| 5,654,223 A | 8/1997 | Jun et al. | 438/254 |
| 5,677,823 A | 10/1997 | Smith | 361/234 |
| 5,729,496 A | 3/1998 | Jung | 365/185 |
| 5,773,325 A * | 6/1998 | Teramoto | 438/151 |
| 5,795,821 A * | 8/1998 | Bacchetta et al. | 438/624 |
| 5,830,575 A * | 11/1998 | Warren et al. | 428/404 |
| 5,834,722 A | 11/1998 | Ma et al. | 257/368 |
| 5,904,509 A * | 5/1999 | Zhang et al. | 438/154 |
| 6,124,147 A * | 9/2000 | Shim et al. | 438/46 |
| 6,130,172 A * | 10/2000 | Fuller et al. | 438/783 |
| 6,140,157 A * | 10/2000 | Warren et al. | 438/149 |
| 6,159,829 A * | 12/2000 | Warren et al. | 438/350 |
| 6,168,980 B1 * | 1/2001 | Yamazaki et al. | 438/162 |
| 6,352,885 B1 * | 3/2002 | Wieczorek et al. | 438/197 |

* cited by examiner

STABLE MEMORY DEVICE THAT UTILIZES ION POSITIONING TO CONTROL STATE OF THE MEMORY DEVICE

BACKGROUND OF THE INVENTION

FIELD OF THE INVENTION

The present invention generally relates to memory devices and, in particular, to a memory element and method utilizing ion positioning to control the state of a memory element.

RELATED ART

A memory element is a structure that stores at least one bit of information. Usually, a plurality of memory elements are programmed (i.e., are set to certain logical states) to define a digital word. Each memory element corresponds to one bit of the digital word and is set to a particular logic state depending on whether the corresponding bit is to be high or low. A detector can determine the value of the digital word by analyzing the states exhibited by the memory elements defining the digital word. In general, the use of memory elements to define digital words is well known in the art.

Many conventional memory elements require a relatively large number of components and/or processing steps to manufacture, thereby increasing the overall cost of producing the memory elements. Thus, a heretofore unaddressed need exists in the industry for an inexpensive memory element requiring a relatively small number of processing steps and/or components to manufacture.

SUMMARY OF THE INVENTION

The present invention overcomes the inadequacies and deficiencies of the prior art as discussed herein. The present invention relates to a simple and inexpensive memory element for storing a bit of data.

The memory element of the present invention utilizes a substrate, a first conductive connection, a second conductive connection, and an ionic layer. The substrate includes a source region, a drain region, and a channel region, which is disposed between the source region and the drain region. The ionic layer includes ions and is coupled to the substrate. The first connection is coupled to the source region, and the second connection is coupled to the drain region. An electrical field is applied through the ionic layer such that the ions in the ionic layer move.

When the memory element is to exhibit a logical high state (i.e., a "1" state), the polarity of the electrical field causes the ions to accumulate close to the channel region. This pulls electrons from the source and drain regions into the channel region, making the channel region conductive. When the memory element is to exhibit a logical low state (i.e., a "0" state), the polarity of the electrical field causes the ions to move away from the channel region. As a result, the channel region becomes non-conductive, and the first conductive connection is, therefore, insulated from the second conductive connection.

In accordance with another feature of the present invention, a controller may be used to manipulate the voltage of a metallic element and the substrate to control the positioning of the ions in the ionic layer. Therefore, the controller may be used to control whether the memory element exhibits a logical high or a logical low state.

In accordance with another feature of the present invention, the ionic layer is comprised of TEOS (tetraethyl orthosilicate) material. TEOS is a material that forms ions when heated to temperatures above approximately 800 degrees Celsius. For best results, the TEOS material is plasma deposited and is doped with boron or phosphorus.

The present invention can also be viewed as providing a method for storing information in memory. Briefly described, the method can be broadly conceptualized by the following steps: providing a substrate; forming a source region and a drain region in the substrate; forming a layer on the substrate; forming ions in the layer; controlling conductivity in a channel region of the substrate that is between the source region and the drain region by the electrical field; and moving the ions in response to the electrical field.

The present invention has many advantages, a few of which are delineated hereafter, as mere examples.

An advantage of the present invention is that a memory element can be easily and inexpensively manufactured.

Another advantage of the present invention is that a stable memory element can be created. Therefore, once the state of the memory element is established, further inputs are not needed to ensure that the state of the memory does not switch. As a result, the voltages applied to the memory element to program the state of the memory element may be turned off or removed after programming.

Other features and advantages of the present invention will become apparent to one skilled in the art upon examination of the following detailed description, when read in conjunction with the accompanying drawings. It is intended that all such features and advantages be included herein within the scope of the present invention, as is defined by the claims.

BRIEF DESCRIPTION OF THE DRAWINGS

The invention can be better understood with reference to the following drawings. The elements of the drawings are not necessarily to scale relative to each other, emphasis instead being placed upon clearly illustrating the principles of the invention. Furthermore, like reference numerals designate corresponding parts throughout the several views.

DETAILED DESCRIPTION OF THE INVENTION

Figure 1:
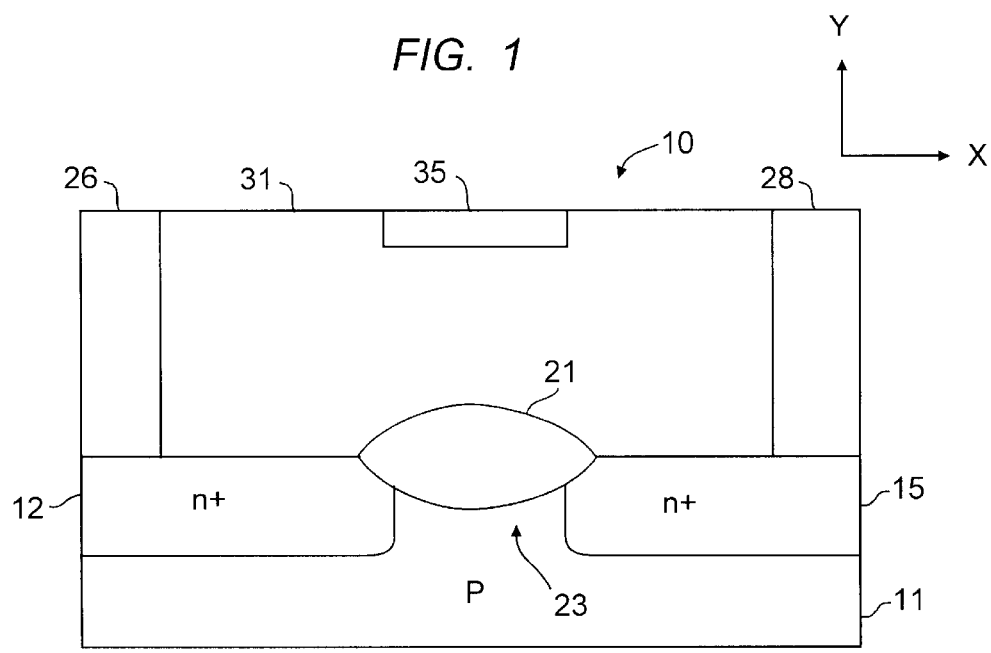
FIG. 1 is a cross-sectional view of the memory element of the present invention.

FIG. 1 depicts a memory element 10 in accordance with the preferred embodiment of the present invention. The memory element 10 includes a substrate 11 that has a source region 12 and a drain region 15. Regions 12 and 15 are preferably comprised of n+ type semiconductor material, which is a well known type of material having an excess of electrons (e⁻) available for transport. The regions 12 and 15 are separated by a portion of the substrate 11 and are connected to a dielectric 21. The portion of the substrate 11 between the regions 12 and 15 forms a channel region 23, which will be discussed in further detail hereinafter. The channel region 23 is preferably comprised of p type semiconductor material, which is a well known type of material having electron vacancies or holes (h⁺).

Conductive connections 26 and 28 are respectively coupled to regions 12 and 15. Furthermore, an ionic layer 31 is formed on the dielectric 21 and the regions 12 and 15. The ionic layer 31 is comprised of a material having ions formed therein. As known in the art, an ion is an atom/molecule having a net electrical charge. In the preferred embodiment, the ions in the ionic layer 31 have a net positive charge. The dielectric 21 separates the ionic layer 31 from the channel region 23. Furthermore, a metallic element 35 is formed on the ionic layer 31 opposite of the dielectric 21, as depicted by FIG. 1. The metallic element 35 is conductive and, in the preferred embodiment, is comprised of a doped polysilicon material, although other materials are possible.

A voltage differential is applied to the substrate 11 and the metallic element 35 such that a voltage difference exists between the voltage of the substrate 11 and the voltage of the metallic element 35. This voltage differential creates an electrical field that passes through the ionic layer 31 and moves the ions located within the ionic layer 31. For example, when the voltage of the metallic layer 35 is greater than the voltage of the substrate 11, the ions in the ionic layer 31 move away from the metallic layer 35 and toward the substrate 11 in response to the electrical field passing through the ionic layer 31. However, when the polarity of the voltage differential is reversed and the voltage of the metallic layer 35 is less than the voltage of the substrate 11, the direction of the electrical field passing through the ionic layer 31 reverses, and the ions in the ionic layer 31 move away from the substrate 11 and toward the metallic layer 35.

Figure 2:
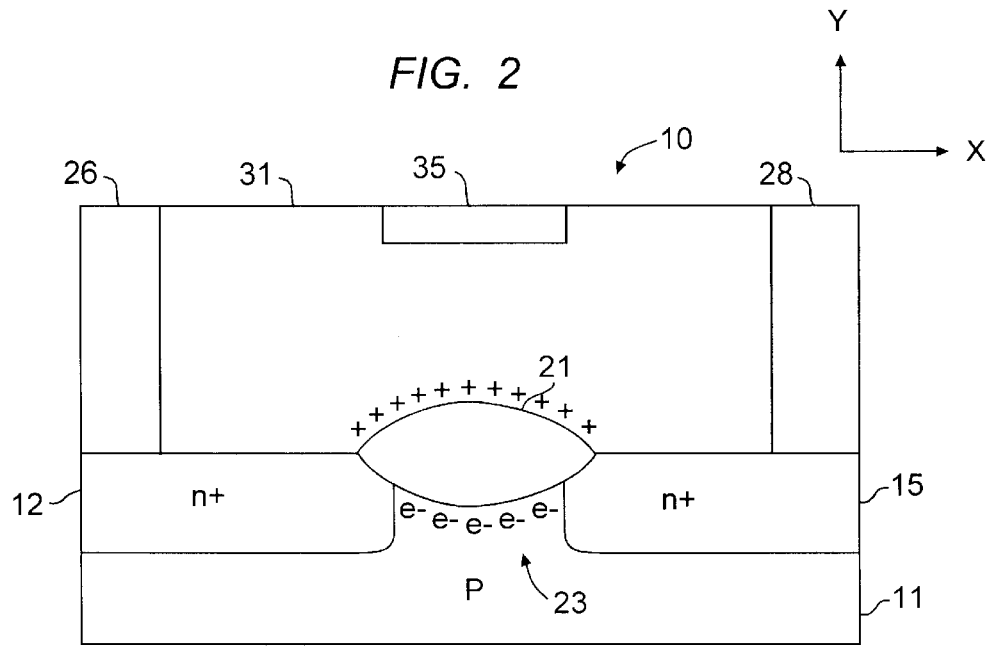
FIG. 2 is a cross-sectional view of the memory element of FIG. 1 when the memory element is exhibiting a logical high state.

FIG. 2 shows the memory element 10 when the voltage differential between substrate 11 and metallic element 35 is of a polarity and of sufficient magnitude to cause the ions of the ionic layer 31 to move away from the metallic element 35 and to accumulate close to the surface of the dielectric 21. The positive charge of the ions in the ionic layer 31 attracts the electrons in regions 12 and 15 and pulls the electrons into the channel region 23. Therefore, electricity is allowed to flow between the regions 12 and 15 via the channel region 23. Consequently, when the memory element 10 is in the state depicted by FIG. 2, a voltage applied at conductive connection 28 can be detected at conductive connection 26, and the memory element 10 is, therefore, in a logical high state.

Figure 3:
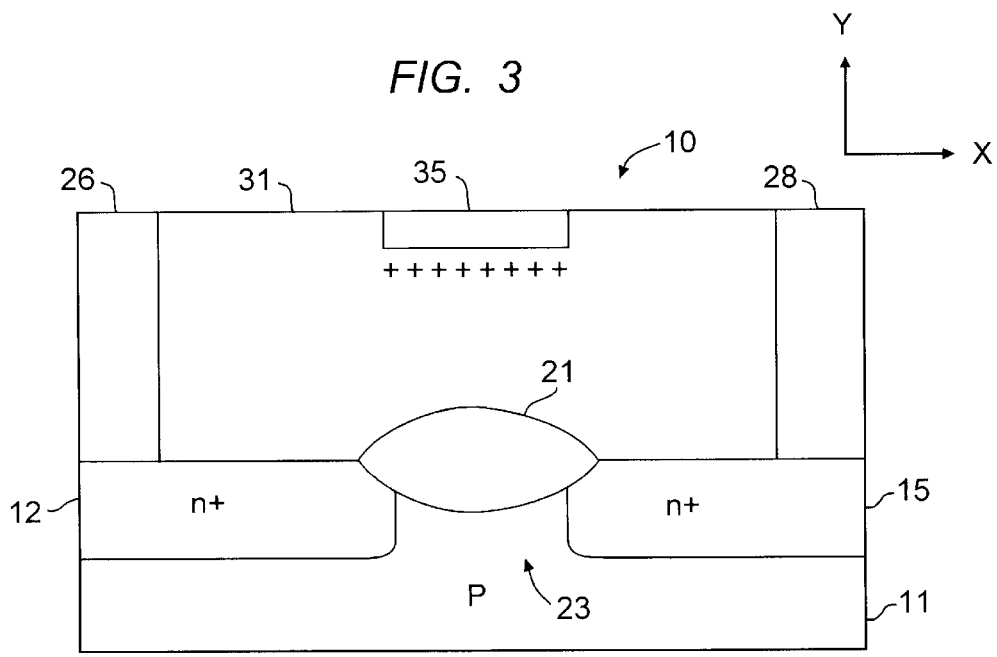
FIG. 3 is a cross-sectional view of the memory element of FIG. 1 when the memory element is exhibiting a logical low state.

FIG. 3 shows the memory element 10 when the voltage differential between substrate 11 and metallic element 35 is of a polarity and of sufficient magnitude to cause the ions of the ionic layer 31 to move toward metallic element 35 and to accumulate close to the surface of the metallic element 35. The ions in the ionic layer 31 are no longer close to the channel region 23 and, therefore, the electrons from regions 12 and 15 are no longer pulled into the channel region 23. Therefore, a sufficient number of electrons do not exist in the channel region 23 to conduct current between the regions 12 and 15. As a result, when the memory element 10 is in the state depicted by FIG. 3, a voltage applied between conductive connections 26 and 28 results in no detectable current, and the memory element 10 is, therefore, in a logical low state.

It should be noted that the amount of voltage differential between the substrate 11 and the metallic element 35 necessary to switch the memory element 10 into either a logical high or a logical low state may vary depending on various factors. In this regard, the type of materials used and the distances between the metallic element 35 and the substrate 11 and between the ionic layer 31 and the channel region 23 affect the magnitude of voltage differential needed to cause the memory element 10 to exhibit either a logical high or logical low state. Therefore, a sufficient voltage differential magnitude to place the memory element 10 in a logical high state is a voltage differential magnitude that pushes enough ions in the ionic layer 31 toward the channel region 23 such that the channel region 23 becomes conductive. Conversely, a sufficient voltage differential magnitude to place the memory element 10 into a logical low state is a voltage differential magnitude that pushes enough ions in the ionic layer 31 toward the metallic element 35 such that the channel region 23 becomes non-conductive.

Figure 4:
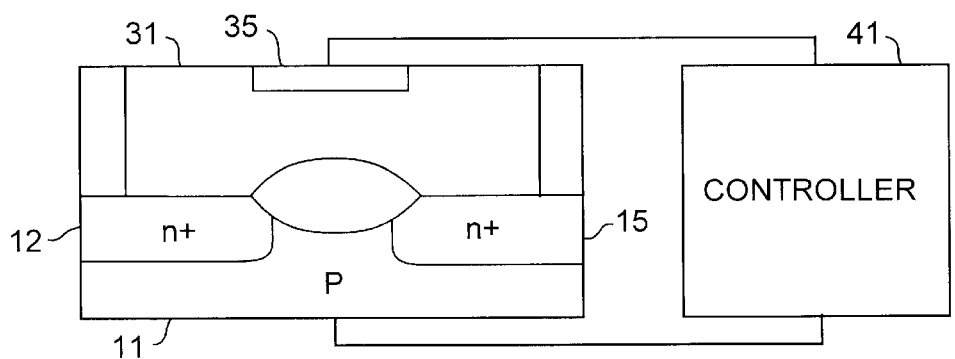
FIG. 4 is a cross-sectional view of the memory element of FIG. 1 coupled to a controller utilized to establish the voltages of the metallic element and the substrate.

FIG. 4 depicts a controller 41 that may be used to change the voltage differential of the metallic element 35 and the substrate 11. In this regard, the controller 41 is coupled to the metallic element 35 and the substrate 11 and is configured through known techniques to independently set the voltages of the metallic element 35 and the substrate 11. Furthermore, the controller 41 may include a processor, such as, but not limited to, a digital signal processor and/or logic gates, that determine(s) the appropriate voltage to apply to the metallic element 35 and the substrate 11. Alternatively, or in combination with the processor, the controller 41 may also include manual devices such as, but not limited to, switches, knobs, dials, buttons, etc. that allow a user to manually input which state the memory element 10 should be programmed to. Therefore, through known techniques, the controller 41 is configured to establish the appropriate voltage differential between the metallic element 35 and the substrate 11 so that the memory element 10 exhibits the desired state. In other words, the controller 41 programs the memory element 10 by controlling the voltage differential between the metallic element 35 and the substrate 11.

Figure 5:
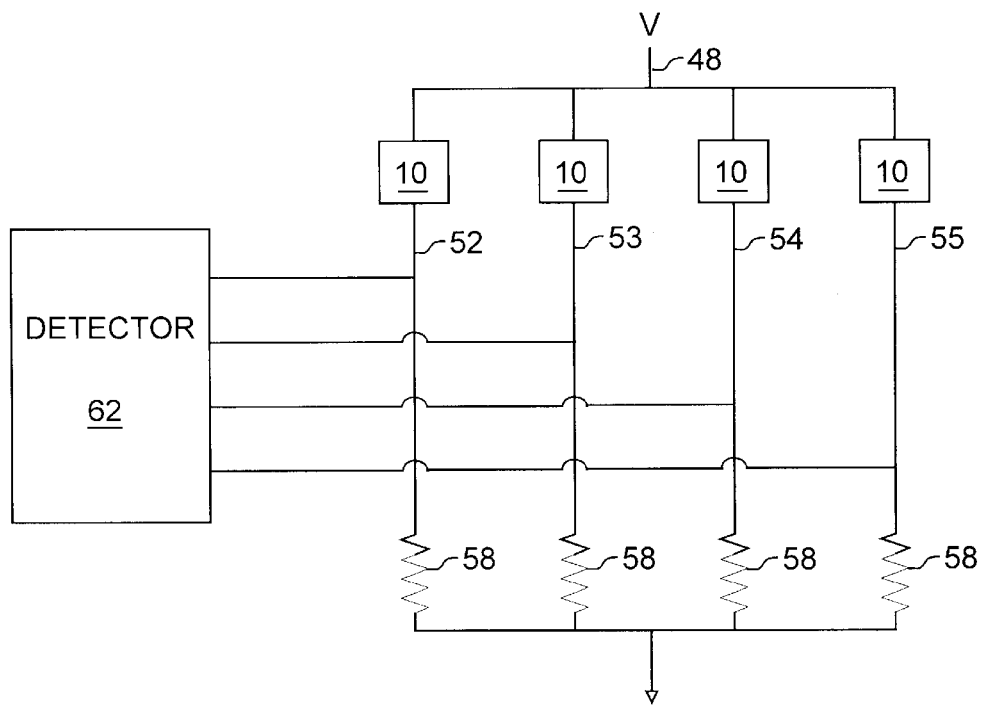
FIG. 5 is a block diagram of a system utilizing the memory element of FIG. 1 to define a four bit digital word.

FIG. 5 depicts a system 45 utilizing a plurality of memory elements 10 to form a digital word. Each memory element 10 corresponds to a bit of the digital word, and, therefore, the memory elements 10 of FIG. 5 define a four bit word. Consequently, the value of the four bit word can be set to a particular value by programming each memory element 10 to exhibit a particular state depending on the value of the bit associated with the memory element 10. It should be noted that the number of memory elements 10 may be varied to change the length of the digital word.

As shown by FIG. 5, a connection 48 preferably couples a voltage (V) to each of the memory elements 10. Preferably, connection 48 is coupled to the conductive connection 28 (FIG. 1) of each of the memory elements 10. Furthermore, connections 52, 53, 54, and 55 are each coupled to one of the memory elements 10, as shown by FIG. 5. In this regard, each connection 52–55 is coupled to the conductive connection 26 (FIG. 1) of its respective memory element 10. Connections 52–55 are preferably coupled to another voltage through resistors 58, as shown by FIG. 5. In FIG. 5, the other voltage coupled to the connections 52–55 through resistors 58 is a ground voltage, although other voltages may be used as long as the voltage coupled to connections 52–55 through the resistors 58 is different than the voltage coupled to the connection 48.

A detector 62 is coupled to the connections 52–55. The detector 62 is configured to detect the voltage on connections 52–55 and to thereby determine the four bit word programmed by the system 45. In this regard, the voltage on each of the connections 52–55 corresponds to the state of its respective memory element 10 and, therefore, corresponds to a bit of the four bit word. Through known techniques, the bits of the four bit word are determined to be either high or low by the detector 62 depending on the voltages of the connections 52–55.

It should be noted that FIG. 5 is shown for exemplary purposes only and does not form a necessary feature of the present invention. Other configurations of system 45 may be employed without departing from the principles of the present invention.

Furthermore, it should also be noted that it is not necessary for the electrical field passing through the ionic layer 31 to be induced by a voltage differential between the metallic element 35 and the substrate 11. Other embodiments may exist that apply a sufficient electrical field to the ionic layer 31 to cause the ions in the ionic layer 31 to move. Any embodiment that applies an electrical field to the ionic layer 31 to cause the ions in the ionic layer 31 to move, as described hereinabove, is sufficient for implementing the present invention.

OPERATION

The preferred use and operation of the memory element 10 and associated methodology are described hereafter.

Figure 6A:
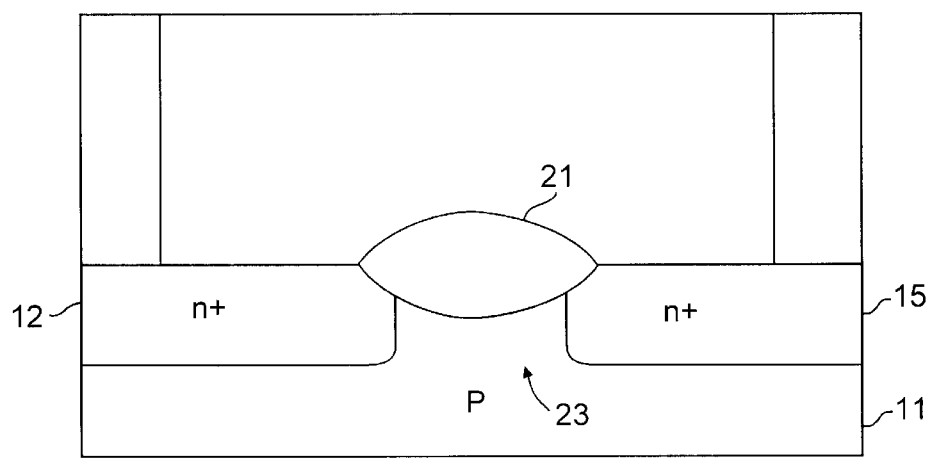
FIG. 6A is a cross-sectional view of the substrate depicted in FIG. 1 after the dielectric has been formed on the substrate.

Referring to FIG. 6A, dielectric 21 is initially formed on substrate 11 via any suitable microfabrication process such as, but not limited to, a LOCOS process. Preferably, the material of the dielectric 21 is, but is not limited to, a thermal oxide (e.g., $SiO_2$). Substrate 11 can be comprised of many different materials and/or layers. However, a portion of the substrate forming a channel region 23 between the regions 12 and 15 is preferably comprised of p type semiconductor material.

Figure 6B:
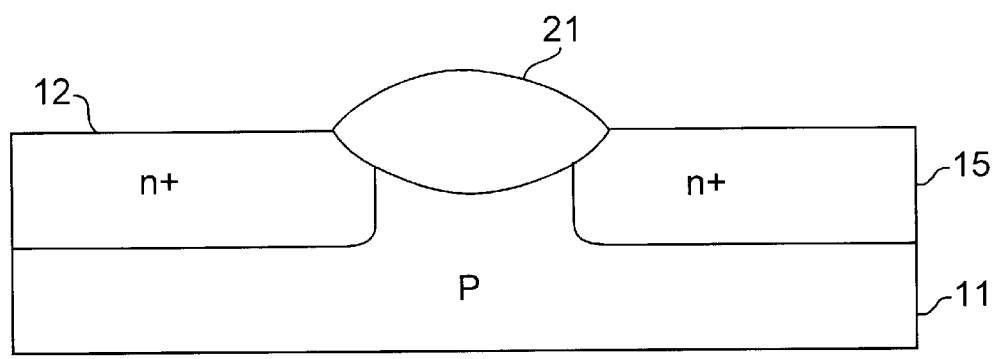
FIG. 6B is a cross-sectional view of the substrate of FIG. 6A after the source region and the drain region have been formed in the substrate.

As shown by FIG. 6B, regions 12 and 15 of the substrate 11 are comprised of n+ type semiconductor material via any suitable micorfabrication process. Preferably, each region 12 and 15 has an end close to the dielectric 21 such that the positive charge of ions accumulated in the ionic layer 31 close to the surface of the dielectric 21 is able to pull electrons from the regions 12 and 15 into the channel region 23. In fact, in the preferred embodiment, the regions 12 and 15 are coupled directly to the dielectric 21, as shown by FIG. 6B. When the regions 12 and 15 are coupled directly to the dielectric 21, as is in the preferred embodiment, the dielectric 21 should be insulating so that the dielectric 21 does not short the regions 12 and 15.

Figure 6C:
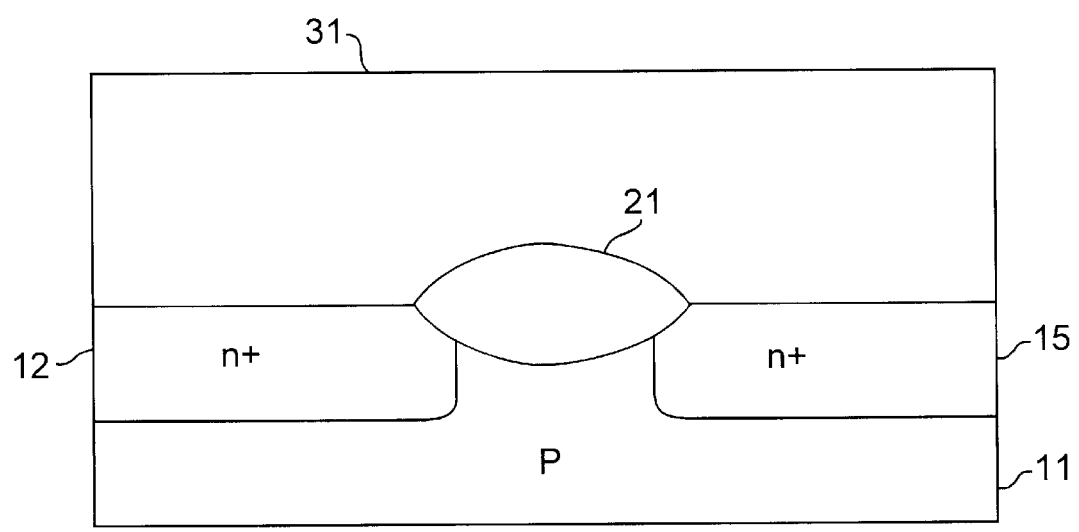
FIG. 6C is a cross-sectional view of the substrate of FIG. 6B after the ionic layer has been formed on the substrate.

Once the dielectric 21 and the regions 12 and 15 are formed on or within the substrate 11, the ionic layer 31 is formed on the dielectric 21 via any suitable microfabrication process, as shown by FIG. 6C. Next, metallic element 35 and conductive connections 26 and 18 are formed via any suitable microfabrication technique, as shown by FIG. 1. In one embodiment, the metallic element 35 is positioned approximately 8000 Angstroms from the dielectric 21, and the thickness (i.e., length in the y-direction) of the dielectric 21 (at the thickest portion of the dielectric 21 ) is approximately 2000 Angstroms. Furthermore, connections 26 and 28 are electrically coupled to the regions 12 and 15. However, it should be noted that thicknesses and distances other than those described hereinabove may be employed without departing from the principles of the present invention.

As set forth hereinbefore, the ionic layer 31 includes ions that can be moved in response to a voltage differential applied across the metallic element 35 and the substrate 11. In the preferred embodiment, the material of the ionic layer 31 is plasma deposited TEOS (tetraethyl orthosilicate) and is doped with either boron or phosphorous. Plasma deposited TEOS forms ions when heated above approximately 800 degrees Celsius (C.). However, for the best results in forming ions, it is desirable to heat TEOS above approximately 950 degrees (C.). Therefore, during fabrication of the element 10 depicted in FIG. 1, the element 10 is preferably heated via a rapid thermal anneal or other type of heating process to above approximately 950 degrees C. for about 10 to 15 seconds. Longer heating durations are possible but are not necessary. The heating of the plasma deposited TEOS, as previously described, causes ions to form in the ionic layer 31.

A plurality of elements 10 are formed according to the process described hereinabove through batch fabrication or other types of fabrication techniques. These elements 10 are then included in the system 45 depicted by FIG. 5. In this regard, the conductive connection 28 of each of the memory elements 10 is coupled to the connection 48, and the conductive connection 26 is coupled to one of the connections 52, 53, 54, or 55. However, as previously set forth, including the memory elements 10 within the system 45 depicted by FIG. 5 is not a necessary feature of the present invention.

As shown by FIG. 4, the substrate 11 and the metallic element 35 of each memory element 10 is coupled to a controller 41, which applies a voltage differential to the substrate 11 and the metallic element 35. To program one of the memory elements 10 to exhibit a logical high, the controller 41 causes the voltage of the metallic element 35 to be higher than the voltage of the substrate 11 such that the ions in the ionic layer 31 accumulate close to the dielectric 21, as shown by FIG. 2. As a result, electrons from the n+ regions 12 and 15 are pulled into the channel region 23 making the channel region 23 conductive. Therefore, current can flow between the regions 12 and 15 and between the connections 26 and 28. Consequently, the detector (FIG. 5) detects the current on the connection 52, 53, 54, or 54 that corresponds with the programmed memory element 10.

Conversely, to program one of the memory elements 10 to exhibit a logical low, the controller 41 causes the voltage of the metallic element 35 to be lower than the voltage of the substrate 11 such that the ions in the ionic layer 31 accumulate close to the metallic element 35, as shown by FIG. 3. As a result, the ions of the ionic layer 31 are too far away from the channel region 23 to pull the electrons of the regions 12 and 15 into the channel region 23. Consequently, current is prevented from flowing between the regions 12 and 15 and between the connections 26 and 28. Therefore, the detector 62 (FIG. 4) is unable to detect current on the connection 52, 53, 54, or 54 that corresponds with the programmed memory element 10, and in response, the detector 62 determines that the programmed memory element 10 is exhibiting a logical low state.

By analyzing the currents passing through connections 52–55, the detector 62 (FIG. 5) can determine the value of the four bit word associated with the system 45. Furthermore, the logical state of any of the memory elements 10 can be switched (i.e. reprogrammed) by reversing or changing the polarity of the voltage differential that was previously applied to substrate 11 and the metallic element 35 of the memory element 10. Consequently, each memory element 10 can be programmed or reprogrammed to exhibit a particular logical state by controlling the location of the ions within the ionic layer 31.

It should be noted that utilization of plasma deposited TEOS as the ionic layer 31 creates a very stable memory element 10. In this regard, the ions formed in the plasma deposited TEOS do not tend to move easily. Therefore, once the state of the memory element 10 is established, the voltage differential applied to the substrate 11 and the metallic element 35 can be removed without switching the state of the memory element 10 (i.e., the memory element 10 is nonvolatile). In fact, it may be desirable to heat the memory element 10 to about 200 degrees C. or higher in programming the memory element 10 to facilitate movement of the ions within the ionic layer 31.

It should be further noted that dimensions for the components of memory element 10 other than those disclosed herein may be used. However, changing the dimensions may affect the voltage differential required to place the memory element 10 in a particular state. In addition, each component of the memory element 10 may include various layers and/or materials not discussed herein as long as the additional layers do not prevent operation of the element 10 as described herein. For example, ionic layer 31 may be comprised of multiple layers of different materials as long as the different materials allow the ions in the ionic layer 31 to move and thereby to switch the state of the element 10.

Furthermore, it should also be noted that the dielectric 21 does not form a necessary part of the present invention. In most embodiments, however, it is desirable to separate the ionic layer 31 and the channel region 23 with some type of insulating material (not necessarily dielectric material) to prevent ions in the ionic layer 31 from passing into the channel region 23.

In concluding the detailed description, it should be noted that it will be obvious to those skilled in the art that many variations and modifications may be made to the preferred embodiment without substantially departing from the principles of the present invention. All such variations and modifications are intended to be included herein within the scope of the present invention and protected by the following claims.

Now, therefore, the following is claimed:

1. A method for storing information in a memory device, the memory device comprising a plurality of memory elements produced by the steps comprising:
   (a) providing a silicon substrate,
   (b) forming a source region and a drain region in the substrate,
   (c) plasma depositing a plasma deposited memory storage layer on the substrate, the plasma deposited memory storage layer having an upper region and a lower region,
   (d) forming a metal electrode on the memory storage layer,
   (e) forming movable ions from the plasma deposited memory storage layer by heating the plasma deposited memory storage layer,
   storing information in the memory device by:
      (i) applying a first voltage to the metal electrode thereby moving the movable ions to the upper region of the plasma deposited memory storage layer,
      (ii) applying a second voltage to the metal electrode thereby moving the movable ions to the lower region of the plasma deposited memory storage layer.

2. The method of claim 1 wherein the plasma deposited memory storage layer comprises $SiO_2$.

3. The method of claim 2 wherein the plasma deposited memory storage layer is maintained at a temperature of at least 200 degrees C. while applying a first voltage to the metal electrode thereby moving the movable ions to the upper region of the plasma deposited memory storage layer, and the plasma deposited memory storage layer is maintained at a temperature of at least 200 degrees C. while applying a second voltage to the metal electrode thereby moving the movable ions to the lower region of the plasma deposited memory storage layer.

4. The method of claim 2 wherein the plasma deposited memory storage layer is TEOS.

5. The method of claim 2 wherein step (e) comprises heating the plasma deposited memory storage layer to a temperature above 950 degrees C.

6. The method of claim 5 wherein heating is conducted using rapid thermal annealing.

7. A method for storing information in a memory device, the memory device comprising a plurality of memory elements produced by the steps comprising:
   (a) providing a silicon substrate,
   (b) forming a source region and a drain region in the substrate,
   (c) plasma depositing a TEOS memory storage layer on the substrate, the TEOS memory storage layer having an upper region and a lower region,
   (d) forming a metal electrode on the memory storage layer,
   (e) forming movable ions from the plasma deposited memory storage layer by rapid thermal annealing the TEOS plasma deposited memory storage layer at a temperature of at least 950° C.,
   storing information in the memory device by:
      (i) heating the TEOS plasma deposited memory storage layer and maintaining the TEOS plasma deposited memory storage layer at a temperature of at least 200 degrees C. while applying a first voltage to the metal electrode thereby moving the movable ions to the upper region of the TEOS plasma deposited memory storage layer
      (ii) heating the TEOS plasma deposited memory storage layer and maintaining the TEOS plasma deposited memory storage layer at a temperature of at least 200 degrees C. while applying a second voltage to the metal electrode thereby moving the movable ions to the lower region of the TEOS plasma deposited memory storage layer.

* * * * *